United States Patent
Zhuo et al.

(10) Patent No.: US 12,550,530 B2
(45) Date of Patent: Feb. 10, 2026

(54) DISPLAY SUBSTRATE, TESTING METHOD THEREFOR AND PREPARATION METHOD THEREFOR, AND DISPLAY PANEL

(71) Applicants: Chengdu BOE Optoelectronics Technology Co., Ltd., Sichuan (CN); BOE Technology Group Co., Ltd., Beijing (CN)

(72) Inventors: Yong Zhuo, Beijing (CN); Yanxia Xin, Beijing (CN); Hongwei Hu, Beijing (CN); Zheng Bao, Beijing (CN); Xueping Li, Beijing (CN); Yihao Wu, Beijing (CN); Xiaoyun Wang, Beijing (CN); Zhongqian Guo, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 581 days.

(21) Appl. No.: 17/921,898

(22) PCT Filed: Jun. 1, 2021

(86) PCT No.: PCT/CN2021/097624
§ 371 (c)(1),
(2) Date: Oct. 27, 2022

(87) PCT Pub. No.: WO2021/259016
PCT Pub. Date: Dec. 30, 2021

(65) Prior Publication Data
US 2023/0171998 A1    Jun. 1, 2023

(30) Foreign Application Priority Data

Jun. 22, 2020  (CN) .......................... 202010574076.0

(51) Int. Cl.
*H10K 59/121* (2023.01)
*H10K 59/12* (2023.01)
(Continued)

(52) U.S. Cl.
CPC ..... *H10K 59/1213* (2023.02); *H10K 59/1201* (2023.02); *H10K 59/1216* (2023.02); *H10K 59/131* (2023.02); *H10K 71/70* (2023.02)

(58) Field of Classification Search
CPC ........... H10K 59/1213; H10K 59/1201; H10K 59/1216; H10K 59/131; H10K 71/70;
(Continued)

(56) References Cited

U.S. PATENT DOCUMENTS 10,269,877 B2 * 4/2019 Hwang .................. H10K 59/88
11,011,085 B2 * 5/2021 Lee ..................... H10K 59/1315
(Continued)

FOREIGN PATENT DOCUMENTS

| CN | 101110443 A | 1/2008 |
| CN | 102956667 A | 3/2013 |

(Continued)

OTHER PUBLICATIONS

CN202010574076.0 first office action.
PCT/CN2021/097624 international search report.

*Primary Examiner* — Chad M Dicke
*Assistant Examiner* — Gary Abel
(74) *Attorney, Agent, or Firm* — IPro, PLLC

(57) ABSTRACT

Provided are a display substrate, a testing method therefor and a preparation method therefor, and a display panel, which are used for improving the success rate of transistor testing. The display substrate comprises a base substrate and a pixel circuit, wherein the pixel circuit comprises an active layer, a first gate insulating layer, a first gate electrode layer, a second gate insulating layer, a second gate electrode layer,
(Continued)

a first interlayer insulating layer, a source/drain electrode layer, and a second interlayer insulating layer. The pixel circuit is divided into a plurality of transistors, and further comprises a gate electrode contact hole and a source/drain electrode contact hole. The source/drain electrode layer comprises a gate electrode test pad which is electrically connected to the first gate electrode layer by means of the gate electrode contact hole, and a source electrode and a drain electrode which are electrically connected to the active layer by means of the source/drain electrode contact hole. The second interlayer insulating layer is provided with a gate electrode test hole and a source/drain electrode test hole, wherein the gate electrode test hole exposes the gate electrode test pad, and the source/drain electrode test hole exposes part of an area in the source/drain electrode layer other than the gate electrode test pad.

11 Claims, 4 Drawing Sheets

(51) Int. Cl.
*H10K 59/131* (2023.01)
*H10K 71/70* (2023.01)

(58) Field of Classification Search
CPC .... H10K 59/12; H10D 86/441; H10D 86/481; H10D 86/60; H10D 86/021; H01L 22/14; H01L 22/30–34
See application file for complete search history.

(56) References Cited

U.S. PATENT DOCUMENTS

| | | |
|---|---|---|
| 2005/0134754 A1 | 6/2005 | Yang et al. |
| 2008/0017855 A1 | 1/2008 | Kim et al. |
| 2013/0049029 A1* | 2/2013 | Kim ............... H10D 86/441 257/E33.053 |
| 2014/0027720 A1 | 1/2014 | Kim et al. |
| 2015/0022211 A1* | 1/2015 | Du ................. G09G 3/006 324/414 |
| 2017/0193901 A1* | 7/2017 | Wang ............. G09G 3/3233 |
| 2020/0168140 A1* | 5/2020 | Chen ............. G09G 3/3291 |
| 2021/0020084 A1 | 1/2021 | Fan et al. |
| 2021/0043710 A1* | 2/2021 | Yun ............... H10K 59/1216 |
| 2021/0126073 A1* | 4/2021 | Xu ................. H10K 59/122 |
| 2021/0134197 A1* | 5/2021 | Ju ................. G09G 3/006 |
| 2022/0102456 A1 | 3/2022 | Bao et al. |
| 2022/0140035 A1* | 5/2022 | Hu ................. H10D 30/6733 257/40 |

FOREIGN PATENT DOCUMENTS

| | | |
|---|---|---|
| CN | 103926761 A | 7/2014 |
| CN | 107946364 A | 4/2018 |
| CN | 109742035 A | 5/2019 |
| CN | 109742037 A | 5/2019 |
| CN | 110190106 A | 8/2019 |
| CN | 111682011 A | 9/2020 |
| JP | 2009016586 A | 1/2009 |

* cited by examiner

DISPLAY SUBSTRATE, TESTING METHOD THEREFOR AND PREPARATION METHOD THEREFOR, AND DISPLAY PANEL

CROSS REFERENCE TO RELATED APPLICATIONS

The application is a US National Stage of International Application No. PCT/CN2021/097624, filed on Jun. 1, 2021, which claims priority from the Chinese Patent Application No. 202010574076.0, filed with the China National Intellectual Property Administration on Jun. 22, 2020 and entitled "DISPLAY SUBSTRATE, TESTING METHOD THEREFOR AND PREPARATION METHOD THEREFOR, AND DISPLAY PANEL", the entire contents of which are incorporated herein by reference.

TECHNICAL FIELD

The disclosure relates to a display substrate, a testing method therefor and a preparation method therefor, and a display panel.

BACKGROUND

With continuous development of a display technology, an organic light emitting diode (OLED) display panel has been increasingly applied to various electronic devices due to its advantages of being self-luminous, wide in viewing angle, high in contrast ratio, low in power consumption, high in response speed and the like.

SUMMARY

An embodiment of the disclosure provides a display substrate. The display substrate includes: a base substrate and a pixel circuit on the base substrate. The pixel circuit includes: an active layer, a first gate insulation layer, a first gate layer, a second gate insulation layer, a second gate layer, a first interlayer insulation layer, a source drain layer and a second interlayer insulation layer disposed on the base substrate in that order; and the pixel circuit includes a plurality of transistors. The pixel circuit further includes: a gate contact hole running through the first interlayer insulation layer and the second gate insulation layer and exposing part of the first gate layer, and a source drain contact hole running through the first interlayer insulation layer, the second gate insulation layer and the first gate insulation layer and exposing part of the active layer. The source drain layer includes: a gate test pad electrically connected with the first gate layer through the gate contact hole, and a source and a drain electrically connected with the active layer through the source drain contact hole. The second interlayer insulation layer includes: a gate test hole and a source drain test hole running through the second interlayer insulation layer in the direction of thickness direction of the second interlayer insulation layer; and the gate test hole exposes the gate test pad, and the source drain test hole exposes part of an area in the source drain layer other than the gate test pad.

In some embodiments, the pixel circuit includes: a first transistor, a second transistor, a third transistor, a fourth transistor, a fifth transistor, a sixth transistor, a seventh transistor, a storage capacitor, a scanning line, a reset line, an initialization signal line and a light-emitting control line. A gate of the third transistor is electrically connected with a first electrode of the storage capacitor, a source of the first transistor and a drain of the second transistor respectively; a source of the third transistor is electrically connected with a drain of the fourth transistor and a drain of the fifth transistor respectively; a drain of the third transistor is electrically connected with a source of the second transistor and a source of the sixth transistor respectively. A gate of the first transistor is electrically connected with the reset line. A drain of the first transistor and a drain of the seventh transistor are electrically connected with the initialization signal line respectively. A second electrode of the storage capacitor is electrically connected with a first power end. A gate of the second transistor and a gate of the fourth transistor are electrically connected with the scanning line respectively. A source of the fourth transistor is electrically connected with a data signal end. A gate of the fifth transistor and a gate of the sixth transistor are electrically connected with the light-emitting control line respectively. A drain of the sixth transistor is electrically connected with the drain of the seventh transistor.

In some embodiments, the first gate layer includes: the second electrode of the storage capacitor, the scanning line, the reset line, the light-emitting control line, the gate of the first transistor, the gate of the second transistor, the gate of the third transistor, the gate of the fourth transistor, the gate of the fifth transistor, the gate of the sixth transistor and the gate of the seventh transistor. The gate contact hole includes: a first gate contact hole exposing part of the reset line, a second gate contact hole exposing part of the light-emitting control line, and a third gate contact hole exposing part of the scanning line. The gate test pad includes: a first gate test pad electrically connected with the reset line through the first gate contact hole, a second gate test pad electrically connected with the light-emitting control line through a second gate contact hole, and a third gate test pad electrically connected with the scanning line through the third gate contact hole. The gate test hole includes: a first gate test hole exposing the first gate test pad, a second gate test hole exposing the second gate test pad, and a third gate test hole exposing the third gate test pad.

In some embodiments, the source drain layer further includes: a first source drain test part, a second source drain test part, a third source drain test part, a fourth source drain test part, and a fifth source drain test part. The first source drain test part is electrically connected with the source of the first transistor, the drain of the second transistor and the gate of the third transistor respectively. The second source drain test part is electrically connected with the drain of the first transistor and the drain of the seventh transistor respectively. The third source drain test part is electrically connected with a source of the fifth transistor. The fourth source drain test part is electrically connected with the drain of the sixth transistor and a source of the seventh transistor respectively. The fifth source drain test part is electrically connected with the source of the fourth transistor. The source drain test hole includes: a first source drain test hole exposing the first source drain test part, a second source drain test hole exposing the second source drain test part, a third source drain test hole exposing the third source drain test part, a fourth source drain test hole exposing the fourth source drain test part, and a fifth source drain test hole exposing the fifth source drain test part.

An embodiment of the disclosure provides a testing method for the above display substrate, including: disconnecting a transistor in part of the pixel circuit by cutting off part of a line in a pixel circuit according to a to-be-tested transistor in the pixel circuit; and performing an electrical test on the to-be-tested transistor through a gate test hole and a source drain test hole.

In some embodiments, the pixel circuit includes: a first transistor, a second transistor, a third transistor, a fourth transistor, a fifth transistor, a sixth transistor, a seventh transistor, a storage capacitor, a scanning line, a reset line, an initialization signal line and a light-emitting control line. The to-be-tested transistor is the first transistor or the seventh transistor, and the disconnecting the transistor in part of the pixel circuit by cutting off part of the line in the pixel circuit according to the to-be-tested transistor in the pixel circuit, includes: disconnecting the second transistor, the third transistor, the fourth transistor, the fifth transistor, the sixth transistor and the storage capacitor from the pixel circuit. The performing an electrical test on the to-be-tested transistor through the gate test hole and the source drain test hole, includes: when the to-be-tested transistor is the first transistor, providing a first voltage signal to a first gate test pad through a first gate test hole, providing a second voltage signal to a first source drain test hole through a first source drain test hole and outputting a test signal of a second source drain test part through a second source drain test hole; and when the to-be-tested transistor is the seventh transistor, providing the first voltage signal to the first gate test pad through the first gate test hole, providing the second voltage signal to a fourth source drain test part through a fourth source drain test hole and outputting a test signal of the second source drain test part through the second source drain test hole.

In some embodiments, the to-be-tested transistor is the third transistor; the disconnecting the transistor in part of the pixel circuit by cutting off part of the line in the pixel circuit according to the to-be-tested transistor in the pixel circuit, includes: disconnecting the first transistor, the second transistor, the fourth transistor, the seventh transistor and the storage capacitor from the pixel circuit. The performing the electrical test on the to-be-tested transistor through the gate test hole and the source drain test hole, includes: providing the first voltage signal to the first source drain test part through the first source drain test hole, providing a third voltage signal to a second gate test pad through a second gate test hole, providing the second voltage signal to a third source drain test part through a third source drain test hole and outputting a test signal of the fourth source drain test part through the fourth source drain test hole.

In some embodiments, the to-be-tested transistor is one of the following: the second transistor, the fourth transistor, the fifth transistor and the sixth transistor; the disconnecting the transistor in part of the pixel circuit by cutting off part of the line in the pixel circuit according to the to-be-tested transistor in the pixel circuit, includes: disconnecting the first transistor, the seventh transistor and the storage capacitor from the pixel circuit. The performing the electrical test on the to-be-tested transistor through the gate test hole and the source drain test hole, includes: when the to-be-tested transistor is the second transistor, providing the first voltage signal to a third gate test pad through a third gate test hole, providing the third voltage signal to the second gate test pad through the second gate test hole, providing the second voltage signal to the fourth source drain test part through the fourth source drain test hole and outputting a test signal of the first source drain test part through the first source drain test hole; when the to-be-tested transistor is the fourth transistor, providing the first voltage signal to the third gate test pad through the third gate test hole, providing the third voltage signal to the second gate test pad through the second gate test hole, providing the second voltage signal to a fifth source drain test part through a fifth source drain test hole and outputting a test signal of the third source drain test part through the third source drain test hole; when the to-be-tested transistor is the fifth transistor, providing the first voltage signal to the second gate test pad through the second gate test hole, providing the third voltage signal to the first source drain test part through the first source drain test hole, providing the second voltage signal to the third source drain test part through the third source drain test hole and outputting a test signal of the fourth source drain test part through the fourth source drain test hole; when the to-be-tested transistor is the sixth transistor, providing the first voltage signal to the second gate test pad through the second gate test hole, providing the third voltage signal to the first source drain test part through the first source drain test hole, providing the second voltage signal to the fourth source drain test part through the fourth source drain test hole and outputting a test signal of the third source drain test part through the third source drain test hole.

An embodiment of the disclosure provides a preparation method for a display substrate, including: forming an active layer, a first gate insulation layer, a first gate layer, a second gate insulation layer, a second gate layer and a first interlayer insulation layer of a pixel circuit on a base substrate in that order, and the pixel circuit comprises a plurality of transistors; forming a gate contact hole running through the first interlayer insulation layer and the second gate insulation layer and exposing part of the first gate layer; forming a source drain contact hole running through the first interlayer insulation layer, the second gate insulation layer and the first gate insulation layer and exposing the active layer; forming a pattern of a source drain layer on the first interlayer insulation layer, and the source drain layer comprises: a gate test pad electrically connected with the first gate layer through the gate contact hole, and a source and a drain electrically connected with the active layer through the source drain contact hole; forming a second interlayer insulation layer on the source drain layer, forming a gate test hole running through the second interlayer insulation layer in the second interlayer insulation layer in the direction of thickness direction of the second interlayer insulation layer and exposing the gate test pad and forming a source drain test hole running through the second interlayer insulation layer in the thickness direction of the second interlayer insulation layer and exposing part of an area in the source drain layer other than the gate test pad.

In some embodiments, the pixel circuit includes: a first transistor, a second transistor, a third transistor, a fourth transistor, a fifth transistor, a sixth transistor, a seventh transistor, a storage capacitor, a scanning line, a reset line, an initialization signal line and a light-emitting control line. The forming the gate contact hole running through the first interlayer insulation layer and the second gate insulation layer and exposing part of the first gate layer, includes: forming, by using a patterning process, a first gate contact hole exposing part of the reset line, a second gate contact hole exposing part of the light-emitting control line and a third gate contact hole exposing part of the scanning line. Forming, on the first interlayer insulation layer, the gate test pad in the source drain layer includes: depositing a source drain material to form an electrode film; forming, by patterning the electrode film, a first gate test pad electrically connected with a gate of the first transistor and a gate of the seventh transistor respectively through the first gate contact hole, a second gate test pad electrically connected with a gate of the fifth transistor and a gate of the sixth transistor respectively through the second gate contact hole, and a third gate test pad electrically connected with a gate of the second transistor and a gate of the fourth transistor respectively through the third gate contact hole. The forming the gate test hole running through the second interlayer insulation layer and exposing the gate test pad, includes: forming, in the second interlayer insulation layer by using a patterning process, a first gate test hole exposing part of the first gate test pad, a second gate test hole exposing the second gate test pad and a third gate test hole exposing the third gate test pad.

In some embodiments, while forming the gate test pad, the source and the drain in the source drain layer, the method further includes: forming a first source drain test part electrically connected with a source of the first transistor, a drain of the second transistor and a gate of the third transistor respectively; forming a second source drain test part electrically connected with a drain of the first transistor and a drain of the seventh transistor respectively; forming a third source drain test part electrically connected with a source of the fifth transistor; forming a fourth source drain test part electrically connected with a drain of the sixth transistor and a source of the seventh transistor respectively; and forming a fifth source drain test part electrically connected with a source of the fourth transistor. The forming the source drain test hole running through the second interlayer insulation layer and exposing part of the source or the drain, includes: forming, in the second interlayer insulation layer by using a patterning process, a first source drain test hole exposing the first source drain test part, a second source drain test hole exposing the second source drain test part, a third source drain test hole exposing the third source drain test part, a fourth source drain test hole exposing the fourth source drain test part, and a fifth source drain test hole exposing the fifth source drain test part.

A display panel provided by an embodiment of the disclosure includes the above display substrate provided by the embodiment of the disclosure and an electroluminescent device located on the display substrate.

DETAILED DESCRIPTION

At present, many unfavorable problems exist in a display region (region AA) of a display panel. A thin film transistor (TFT) pixel drive circuit is an important component of an OLED display panel. In the related art, a property of the TFT is evaluated by an electrical test performed on a test element group (TEG) in a non-display region, however, testing for the TEG is difficult to accurately represent the property of the TFT in the display region. Currently, a mode of overlap joint by digging a hole is under development, then a probe is used to be in overlap joint to a source electrode, a drain and a gate of the TFT to test the property of the TFT in the display region, and usually platinum is used to be in overlap joint to the source electrode, the drain and the gate of the TFT. However, during overlap joint, platinum plating or an overlap joint is difficult to confirm, a result of a TFT electrical test fluctuates substantially, and a success rate of the TFT electrical test is low.

In view of the above, the method of the electrical test on the TFT in the display region in the related art is low in test success rate.

In order to make objectives, technical solutions and advantages of embodiments of the disclosure clearer, the technical solutions of the embodiments of the disclosure will be described clearly and completely below with reference to the accompanying drawings of the embodiments of the disclosure. A thickness and a shape of each film layer in the accompanying drawings do not reflect a true scale and are only intended to contents of the disclosure. Apparently, the described embodiments are some, but not all, embodiments of the disclosure. All other embodiments obtained by those ordinarily skilled in the art without creative work on the basis of the described embodiments of the disclosure fall within the protection scope of the disclosure.

Unless otherwise defined, technical or scientific terms used herein should be commonly understood by those ordinarily skilled in the art of the disclosure. "First", "second" and other similar words used in the specification and the claims of the disclosure do not denote any sequence, quantity or significance and are only used for distinguishing different components. "Include" or "contain" or other similar words means that a component or an item preceding the word covers components or items and their equivalents listed after the word without excluding other components or items. "Inner", "outer", "upper", "lower" and the like are only used for denoting a relative position relation, and when an absolute position of a described object changes, the relative position relation may also change correspondingly.

Figure 1:
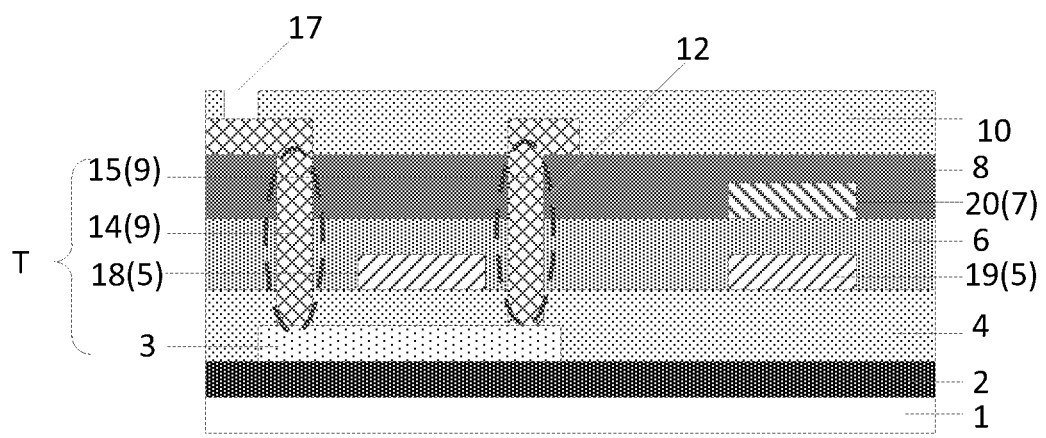
FIG. 1 is a schematic structural diagram of a display substrate provided by an embodiment of the disclosure.
Figure 2:
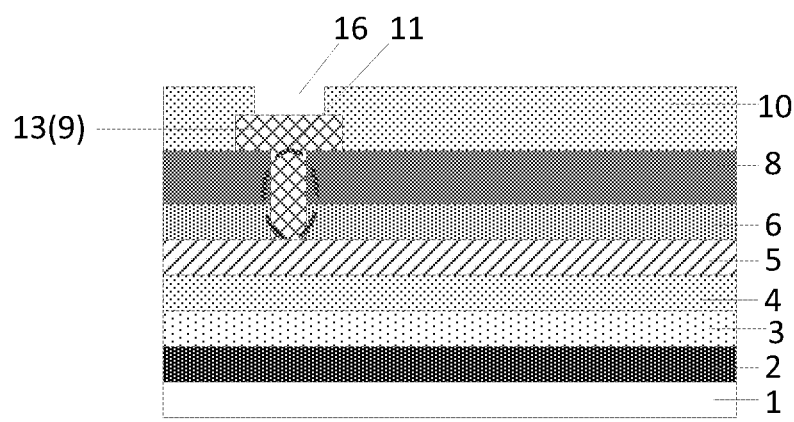
FIG. 2 is a schematic structural diagram of another display substrate provided by an embodiment of the disclosure.

An embodiment of the disclosure provides a display substrate, as shown in FIG. 1 and FIG. 2, the display substrate includes: a base substrate 1 and a pixel circuit on the base substrate 1.

The pixel circuit includes: an active layer 3, a first gate insulation layer 4, a first gate layer 5, a second gate insulation layer 6, a second gate layer 7, a first interlayer insulation layer 8, a source drain layer 9 and a second interlayer insulation layer 10 disposed on the base substrate 1 in in that order. The pixel circuit comprises a plurality of transistors T.

The pixel circuit further includes: a gate contact hole 11 running through the first interlayer insulation layer 8 and the second gate insulation layer 6 and exposing part of the first gate layer 5, and a source drain contact hole 12 running through the first interlayer insulation layer 8, the second gate insulation layer 6 and the first gate insulation layer 4 and exposing part of the active layer 3.

The source drain layer 9 includes: a gate test pad 13 electrically connected with the first gate layer 5 through the gate contact hole 11, a source electrode 14 and a drain 15 electrically connected with the active layer 3 through the source drain contact hole 12.

The second interlayer insulation layer 10 has: a gate test hole 16 and a source drain test hole 17 running through the second interlayer insulation layer in the thickness direction.

The gate test hole 16 exposes the gate test pad 13 (it is worth noting that during actual application, the gate test hole 16 may expose only the gate test pad 13 in part of an area), and the source drain test hole 17 exposes part of an area in the source drain layer 9 other than the gate test pad 13.

According to the display substrate provided by the embodiment of the disclosure, before forming the source drain layer, a gate contact hole exposing part of the first gate layer is formed in an area where the gate test pad needs to be arranged, in this way, the gate test pad may be formed while the source and drains are formed, without additionally arranging platinum in an overlap joint mode as a test probe, thus, contact resistance between the gate test pad and the first gate layer may be reduced, a voltage signal may be accurately input into a transistor through the gate test pad during an electrical test, so a success rate of the electrical test for the transistor in the pixel circuit can be improved. Moreover, a capacity of continuous testing for a drive transistor in the pixel circuit can be improved, preparation process flows of the display substrate can further be saved, and a preparation cost and a testing cost of the display substrate are reduced.

Figure 3:
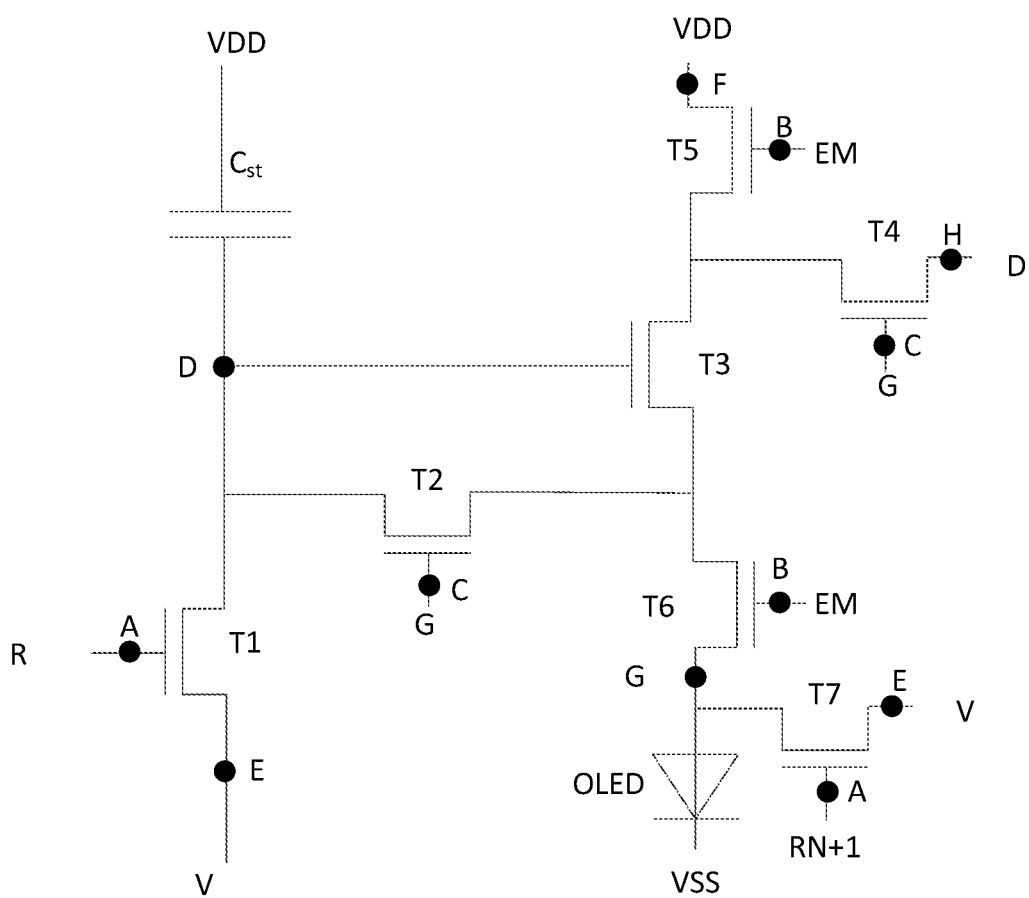
FIG. 3 is an equivalent circuit diagram of a pixel circuit in a display substrate provided by an embodiment of the disclosure.

In some embodiments, as shown in FIG. 3, the pixel circuit includes: a first transistor T1, a second transistor T2, a third transistor T3, a fourth transistor T4, a fifth transistor T5, a sixth transistor T6, a seventh transistor T7, a storage capacitor Cst, a scanning line G, a reset line R, an initialization signal line V and a light-emitting control line EM.

A gate of the third transistor T3 is electrically connected with a first electrode of the storage capacitor Cst, a source of the first transistor T1 and a drain of the second transistor T2 respectively. A source of the third transistor T3 is electrically connected with a drain of the fourth transistor T4 and a drain of the fifth transistor T5 respectively. A drain of the third transistor T3 is electrically connected with a source of the second transistor T2 and a source of the sixth transistor T6 respectively.

Agate of the first transistor T1 is electrically connected with the reset line R.

A drain of the first transistor T1 and a drain of the seventh transistor T7 are electrically connected with the initialization signal line V respectively.

A second electrode of the storage capacitor Cst is electrically connected with a first power end VDD.

A gate of the second transistor T2 and a gate of the fourth transistor T4 are electrically connected with the scanning line G respectively.

A source of the fourth transistor T4 is electrically connected with a data signal end D.

A gate of the fifth transistor T5 and a gate of the sixth transistor T6 are electrically connected with the light-emitting control line EM respectively.

A drain of the sixth transistor T6 is electrically connected with the drain of the seventh transistor T7.

During specific implementation, the active layer may be formed by patterning a semiconductor material, and the active layer includes active layers of the first transistor T1, the second transistor T2, the third transistor T3, the fourth transistor T4, the fifth transistor T5, the sixth transistor T6 and the seventh transistor T7. For example, the active layers of all the transistors are integrated. The active layer of each transistor may include a source electrode region, a drain region and a channel region between the source electrode region and the drain region. The active layer may be made of, for example, amorphous silicon, polycrystalline silicon, oxide semiconductor materials and the like. It needs to be noted that the source electrode region and the drain region in the active layer may be a region doped with an n-type impurity or a p-type impurity.

During specific implementation, the first gate layer includes: the second electrode of the storage capacitor Cst, the scanning line G, the reset line R, the light-emitting control line EM, the gate of the first transistor T1, the gate of the second transistor T2, the gate of the third transistor T3, the gate of the fourth transistor T4, the gate of the fifth transistor T5, the gate of the sixth transistor T6 and the gate of the seventh transistor T7.

During specific implementation, the second gate layer may include, for example, the first electrode of the storage capacitor Cst, the initialization signal line V and a light blocking layer.

It needs to be noted that FIG. 1 illustrates a sectional view of the display substrate provided by the embodiment of the disclosure by taking only one transistor T as an example, and FIG. 2 illustrates a sectional view of the display substrate provided by the embodiment of the disclosure by taking only one gate test pad as an example. During specific implementation, as shown in FIG. 1 and FIG. 2, a buffer layer 2 is also provided between the base substrate 1 and the active layer 3. In FIG. 1, the first gate layer 5 includes a gate electrode 18 of the transistor T and the second electrode 19 of the storage capacitor Cst, and the second gate layer 7 includes the first electrode 20 of the storage capacitor Cst.

In some embodiments, as for the pixel circuit shown in FIG. 3, the gate contact hole includes: a first gate contact hole exposing part of the reset line R, a second gate contact hole exposing part of the light-emitting control line EM, and a third gate contact hole exposing part of the scanning line G.

The gate test pad includes: a first gate test pad A electrically connected with the reset line R through the first gate contact hole, a second gate test pad B electrically connected with the light-emitting control line EM through a second gate contact hole, and a third gate test pad C electrically connected with the scanning line G through the third gate contact hole.

The gate test hole includes: a first gate test hole exposing the first gate test pad A, a second gate test hole exposing the second gate test pad B, and a third gate test hole exposing the third gate test pad C.

In other words, during specific implementation, in the display substrate shown in FIG. 2, the gate test pad 13 may be the first gate test pad, and correspondingly, the first gate layer 5 in FIG. 2 is the reset line. The gate test pad 13 may also be the second gate test pad, and correspondingly, the first gate layer 5 in FIG. 2 is the light-emitting control line. Certainly, the gate test pad 13 in FIG. 2 may also be the third gate test pad, and correspondingly, the first gate layer 5 in FIG. 2 is the scanning line.

During specific implementation, the reset line R is electrically connected with the gate of the first transistor T1 and the gate of the seventh transistor T7 respectively, that is, the first gate test pad A is electrically connected with the gate of the first transistor T1 and the gate of the seventh transistor T7 respectively, so when the electrical test is performed on the transistor, a voltage signal is input into the first gate test pad A, and then the voltage signal can be provided to the gate of the first transistor T1 and the gate of the seventh transistor T7.

During specific implementation, the light-emitting control line EM is electrically connected with the gate of the fifth transistor T5 and the gate of the sixth transistor T6 respectively, that is, the second gate test pad B is electrically connected with the gate of the fifth transistor T5 and the gate of the sixth transistor T6 respectively, so when the electrical test is performed on the transistor, a voltage signal is input into the second gate test pad B, and then the voltage signal can be provided to the gate of the fifth transistor T5 and the gate of the sixth transistor T6.

During specific implementation, the scanning line G is electrically connected with the gate of the second transistor T2 and the gate of the fourth transistor T4 respectively, that is, the third gate test pad C is electrically connected with the gate of the second transistor T2 and the gate of the fourth transistor T4 respectively, so when the electrical test is performed on the transistor, a voltage signal is input into the third gate test pad C, and then the voltage signal can be provided to the gate of the second transistor T2 and the gate of the fourth transistor T4.

In some embodiments, as for the pixel circuit shown in FIG. 3, the source drain layer further includes: a first source drain test part D, a second source drain test part E, a third source drain test part F, a fourth source drain test part G and a fifth source drain test part H.

The first source drain test part D is electrically connected with the source of the first transistor T1, the drain of the second transistor T2 and the gate of the third transistor T3 respectively.

The second source drain test part E is electrically connected with the drain of the first transistor T1 and the drain of the seventh transistor T7 respectively.

The third source drain test part F is electrically connected with a source of the fifth transistor T5.

The fourth source drain test part G is electrically connected with the drain of the sixth transistor T6 and a source of the seventh transistor T7 respectively.

The fifth source drain test part H is electrically connected with the source of the fourth transistor T4.

The source drain test hole includes: a first source drain test hole exposing the first source drain test part D, a second source drain test hole exposing the second source drain test part E, a third source drain test hole exposing the third source drain test part F, a fourth source drain test hole exposing the fourth source drain test part G, and a fifth source drain test hole exposing the fifth source drain test part H.

During specific implementation, a voltage signal may be input into the source of the first transistor T1 through the first source drain test part D, a voltage signal may also be input into the drain of the second transistor T2 through the first source drain test part D, or a voltage signal may be input into the gate of the third transistor T3 through the first source drain test part D.

During specific implementation, a signal may be communicated with the drain of the first transistor T1 through the second source drain test part E, or a signal may be transmitted to the drain of the seventh transistor T7 through the second source drain test part E.

During specific implementation, a signal may be communicated with the source of the fifth transistor T5 through the third source drain test part F.

During specific implementation, a signal may be communicated with the drain of the sixth transistor T6 through the fourth source drain test part G.

During specific implementation, a signal may be communicated with the source of the fourth transistor T4 through the fifth source drain test part H.

During specific implementation, the respective source drain test parts are used for communicated a signal with electrodes of the transistors, here a voltage signal may be input through the source drain test parts, or a voltage signal may be output through the source drain test parts.

In the display substrate provided by the embodiment of the disclosure, the electrical test may be performed on the respective transistors in the pixel circuit by using the respective gate test pads and the respective source drain test pads.

As the respective gate test pads are formed while the source drain is formed, platinum does not need to be additionally arranged in an overlap joint mode to serve as a test probe, thus, contact resistance between the gate test pad and the first gate layer may be reduced, a voltage signal may be accurately input into a transistor through the gate test pad during an electrical test, so a success rate of the electrical test for all the transistors in the pixel circuit can be improved.

During specific implementation, the corresponding gate test pads and source drain test parts may be selected according to demands, so that the electrical test for the transistors in the pixel circuit is realized.

It needs to be noted that in the pixel circuit shown in FIG. 3 and provided by the embodiment of the disclosure, it is only intended to show an electrical connection relation among the gate test pads, the source drain test parts and the transistors, and specific locations of the gate test pads and the source drain test parts may be selected according to actual patterns of film layers in the display substrate.

It needs to be noted that during specific implementation, each source drain test part in the source drain layer may be formed by being integrally with the source or the drain of each transistor. Each source drain test part in the source drain layer may multiplex the source or the drain of the transistor, that is, the source or the drain per se of the transistor may be used as an test part for the electrical test.

During specific implementation, in the display substrate provided by the embodiment of the disclosure, each transistor may be a thin film transistor.

Figure 4:
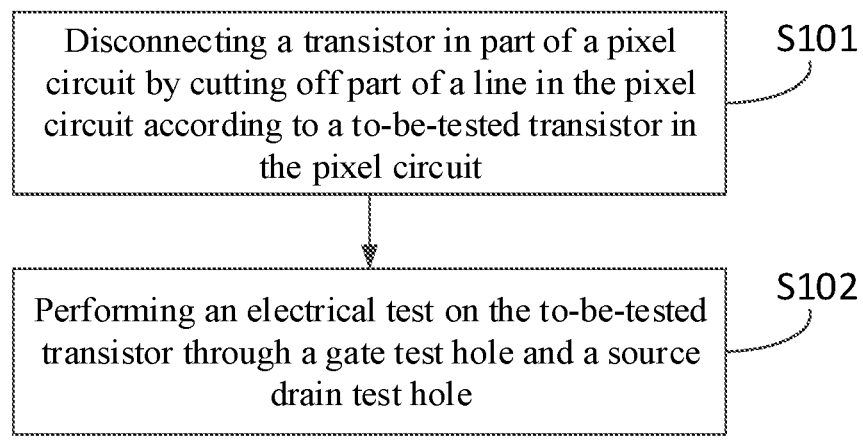
FIG. 4 is a schematic flow chart of a testing method for a display substrate provided by an embodiment of the disclosure.

Based on the same inventive concept, an embodiment of the disclosure further provides a testing method for the above display substrate, as shown in FIG. 4, including: S101, disconnecting a transistor in part of the pixel circuit by cutting off part of a line in a pixel circuit according to a to-be-tested transistor in the pixel circuit; and S102, performing an electrical test on the to-be-tested transistor through a gate test hole and a source drain test hole.

Through the testing method for the display substrate provided by the embodiment of the disclosure, as a gate test pad is formed while a source and a drain is formed, platinum does not need to be additionally arranged in an overlap joint mode to serve as a test probe, thus, contact resistance between the gate test pad and the first gate layer may be reduced, a voltage signal may be accurately input into a transistor through the gate test pad during an electrical test, so a success rate of the electrical test for the transistor in the pixel circuit can be improved.

Moreover, a capacity of continuous testing for a drive transistor in the pixel circuit can be improved, preparation process flows of the display substrate can be saved, and a preparation cost and an electrical test cost of the display substrate are reduced.

In some embodiments, the pixel circuit shown in FIG. 3 includes: a first transistor T1, a second transistor T2, a third transistor T3, a fourth transistor T4, a fifth transistor T5, a sixth transistor T6, a seventh transistor T7, a storage capacitor Cst, a scanning line G, a reset line R, an initialization signal line V and a light-emitting control line EM.

When the to-be-tested transistor is the first transistor T1 or the seventh transistor T7, the disconnecting the transistor in part of the pixel circuit by cutting off part of the line in the pixel circuit according to the to-be-tested transistor in the pixel circuit, includes:

disconnecting the second transistor T2, the third transistor T3, the fourth transistor T4, the fifth transistor T5, the sixth transistor T6 and the storage capacitor Cst from the pixel circuit; and the performing the electrical test on the to-be-tested transistor through the gate test hole and the source drain test hole, includes:

when the to-be-tested transistor is the first transistor T1, providing a first voltage signal V1 to a first gate test pad A through a first gate test hole, providing a second voltage signal V2 to a first source drain test part D through a first source drain test hole and outputting a test signal V4 of a second source drain test part E through a second source drain test hole;

when the to-be-tested transistor is the seventh transistor T7, providing a first voltage signal V1 to the first gate test pad A through the first gate test hole, providing a second voltage signal V2 to a fourth source drain test part G through a fourth source drain test hole and outputting a test signal V4 of the second source drain test part E through the second source drain test hole.

In some embodiments, the to-be-tested transistor is the third transistor T3; and the disconnecting the transistor in part of the pixel circuit by cutting off part of the line in the pixel circuit according to the to-be-tested transistor in the pixel circuit, includes:

disconnecting the first transistor T1, the second transistor T2, the fourth transistor T4, the seventh transistor T7 and the storage capacitor Cst from the pixel circuit; and the performing the electrical test on the to-be-tested transistor through the gate test hole and the source drain test hole, includes:

providing a first voltage signal V1 to the first source drain test part D through the first source drain test hole, providing a third voltage signal V3 to a second gate test pad B through a second gate test hole, providing a second voltage signal V2 to a third source drain test part F through a third source drain test hole and outputting a test signal V4 of the fourth source drain test part G through the fourth source drain test hole.

In other words, the third voltage signal V3 is provided for the second gate test pad B through the second gate test hole so as to control the fifth transistor T5 and the sixth transistor T6 to be turned on. During the electrical test, a source of the fifth transistor T5 is used as a source electrode end of the third transistor T3, a drain of the sixth transistor T6 is used as a drain end of the third transistor T3, so that testing of the third transistor T3 can be realized, and a testing success rate of the third transistor T3 can be improved.

In some embodiments, the to-be-tested transistor is one of the following: the second transistor T2, the fourth transistor T4, the fifth transistor T5 or the sixth transistor T6;

the disconnecting the transistor in part of the pixel circuit by cutting off part of the line in the pixel circuit according to the to-be-tested transistor in the pixel circuit, includes:

disconnecting the first transistor T1, the seventh transistor T7 and the storage capacitor Cst from the pixel circuit; and the performing the electrical test on the to-be-tested transistor through the gate test hole and the source drain test hole, includes:

when the to-be-tested transistor is the second transistor T2, providing a first voltage signal V1 to a third gate test pad C through a third gate test hole, providing a third voltage signal V3 to the second gate test pad B through the second gate test hole, providing a second voltage signal V2 to the fourth source drain test part G through the fourth source drain test hole and outputting a test signal V4 of the first source drain test part D through the first source drain test hole;

when the to-be-tested transistor is the fourth transistor T4, providing a first voltage signal V1 to the third gate test pad C through the third gate test hole, providing a third voltage signal V3 to the second gate test pad B through the second gate test hole, providing a second voltage signal V2 to a fifth source drain test part H through a fifth source drain test hole and outputting a test signal V4 of the third source drain test part F through the third source drain test hole;

when the to-be-tested transistor is the fifth transistor T5, providing a first voltage signal V1 to the second gate test pad B through the second gate test hole, providing a third voltage signal V3 to the first source drain test part D through the first source drain test hole, providing a second voltage signal V2 to the third source drain test part F through the third source drain test hole and outputting a test signal V4 of the fourth source drain test part G through the fourth source drain test hole; and when the to-be-tested transistor is the sixth transistor T6, providing a first voltage signal V1 to the second gate test pad B through the second gate test hole, providing a third voltage signal V3 to the first source drain test part D through the first source drain test hole, providing a second voltage signal V2 to the fourth source drain test part G through the fourth source drain test hole and outputting a test signal V4 of the third source drain test part F through the third source drain test hole.

During specific implementation, the first voltage signal may be, for example, an alternating current voltage signal.

During specific implementation, the first voltage signal V1 may be, for example, in a range from −15 V to 15 V, or a range from −10 V to 10 V, the second voltage signal V2 may be, for example, 0 V, and the third voltage signal V3 may be, for example, −7 V. When the test signal V4 is −5.1 V or −0.1 V, it can be considered that the transistor meets a testing condition, that is, the transistor passes the electrical test.

Figure 5:
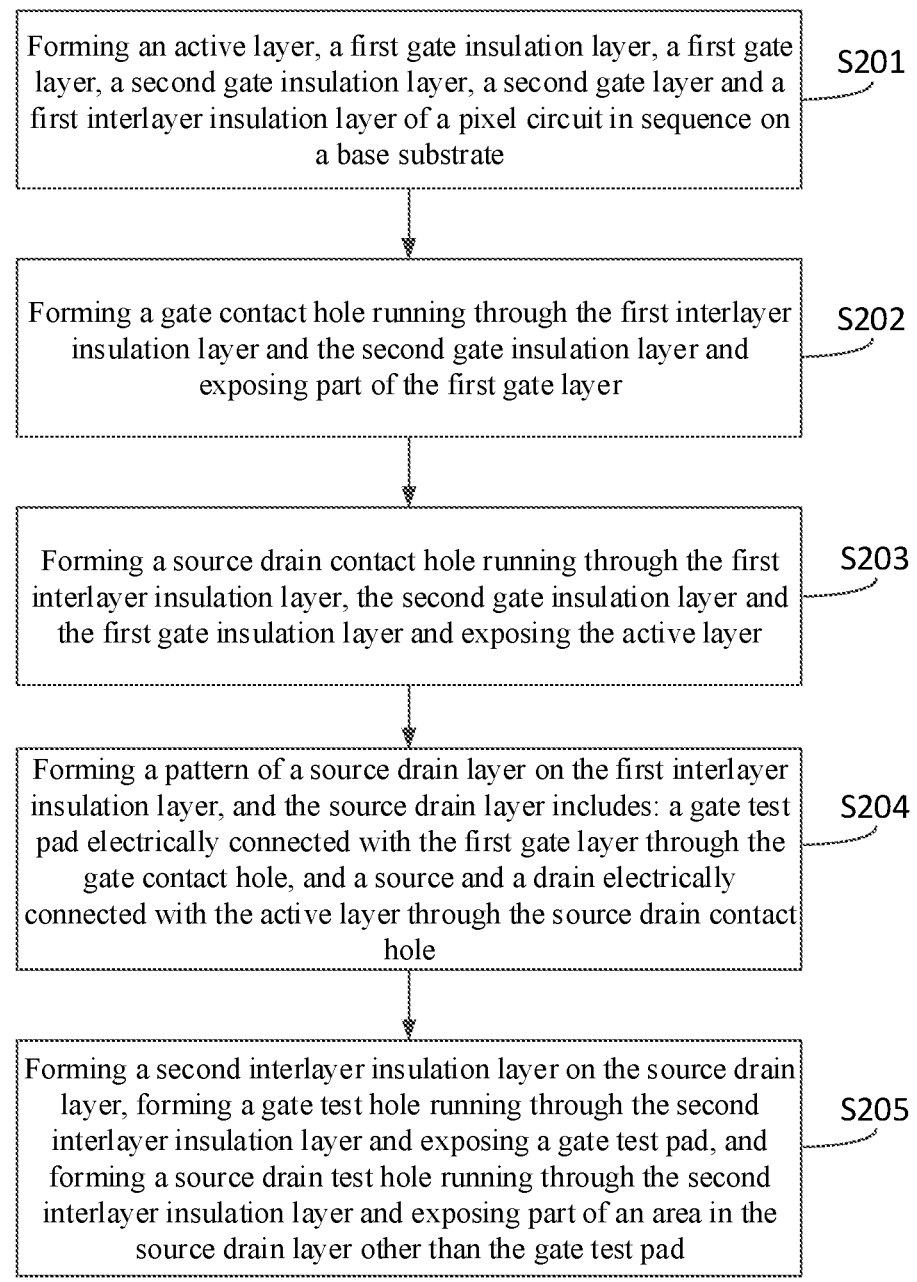
FIG. 5 is a schematic flow chart of a preparation method for a display substrate provided by an embodiment of the disclosure.

Based on the same inventive concept, an embodiment of the disclosure further provides a preparation method for a display substrate, as shown in FIG. 5, including:

S201, forming an active layer, a first gate insulation layer, a first gate layer, a second gate insulation layer, a second gate layer and a first interlayer insulation layer of a pixel circuit on a base substrate in that order, and the pixel circuit includes a plurality of transistors;

S202, forming a gate contact hole running through the first interlayer insulation layer and the second gate insulation layer and exposing part of the first gate layer;

S203, forming a source drain contact hole running through the first interlayer insulation layer, the second gate insulation layer and the first gate insulation layer and exposing the active layer;

S204, forming a pattern of a source drain layer on the first interlayer insulation layer, and the source drain layer includes: a gate test pad electrically connected with the first gate layer through the gate contact hole, and a source and a drain electrically connected with the active layer through the source drain contact hole;

S205, forming a second interlayer insulation layer on the source drain layer, forming a gate test hole running through the second interlayer insulation layer in the thickness direction and exposing a gate test pad, and forming a source drain test hole running through the second interlayer insulation layer in the thickness direction and exposing part of an area in the source drain layer other than the gate test pad.

Through the preparation method for the display substrate provided by the embodiment of the disclosure, before forming the source drain layer, a gate contact hole exposing the first gate layer is formed in an area where the gate test pad is arranged, in this way, a pattern of the gate test pad may be formed while a source drain is formed, platinum does not need to be additionally arranged subsequently in an overlap joint mode to serve as a test probe, thus, contact resistance between the gate test pad and the first gate layer may be reduced, a voltage signal may be accurately input into a transistor through the gate test pad during an electrical test for a finished display substrate, so a success rate of the electrical test for the transistor in the pixel circuit can be improved. Moreover, a capacity of continuous testing for a drive transistor in the pixel circuit can be improved, preparation process flows of the display substrate can be saved, and a preparation cost and a testing cost of the display substrate are reduced.

In some embodiments, the pixel circuit includes: a first transistor, a second transistor, a third transistor, a fourth transistor, a fifth transistor, a sixth transistor, a seventh transistor, a storage capacitor, a scanning line, a reset line, an initialization signal line and a light-emitting control line.

In S202, the forming a gate contact hole running through the first interlayer insulation layer and the second gate insulation layer and exposing part of the first gate layer, includes:

forming a first gate contact hole exposing part of the reset line, a second gate contact hole exposing part of the light-emitting control line and a third gate contact hole exposing part of the scanning line respectively via a patterning process.

In some embodiments, in S204, forming, on the first interlayer insulation layer, the gate test pad in the source drain layer, includes:

forming an electrode film by depositing a source drain material; and forming a first gate test pad electrically connected with a gate of the first transistor and a gate of the seventh transistor respectively through the first gate contact hole, a second gate test pad electrically connected with a gate of the fifth transistor and a gate of the sixth transistor respectively through the second gate contact hole, and a third gate test pad electrically connected with a gate of the second transistor and a gate of the fourth transistor respectively through the third gate contact hole respectively by patterning the electrode film.

Through the preparation method for the display substrate provided by the embodiment of the disclosure, before forming the source drain layer, the gate contact hole exposing the first gate layer is formed in an area where the gate test pad is arranged, in this way, when the source drain material is deposited, the material makes contact with the first gate layer through the gate contact hole, then a pattern of the gate test pad may be formed by using the patterning process, the contact resistance between the gate test pad and the first gate layer can be reduced, during the electrical test, a voltage signal can be accurately input into the transistor through the gate test pad, and thus the success rate of the electrical test for the transistors in the pixel circuit of the display substrate can be improved.

In some embodiments, in S205, the forming the gate test hole running through the second interlayer insulation layer in the thickness direction and exposing a gate test pad, includes:

forming a first gate test hole exposing the first gate test pad, a second gate test hole exposing the second gate test pad and a third gate test hole exposing the third gate test pad in the second interlayer insulation layer by using a patterning process.

In some embodiments, in S204, while forming the gate test pad, the source and the drain in the source drain layer, the method further includes:

forming a first source drain test part electrically connected with a source of the first transistor, a drain of the second transistor and a gate of the third transistor respectively;

forming a second source drain test part electrically connected with a drain of the first transistor and a drain of the seventh transistor respectively is formed;

forming a third source drain test part electrically connected with a source of the fifth transistor;

forming a fourth source drain test part electrically connected with a drain of the sixth transistor and a source of the seventh transistor respectively; and forming a fifth source drain test part electrically connected with a source of the fourth transistor.

In S205, the forming a source drain test hole running through the second interlayer insulation layer in the thickness direction and exposing part of the source or the drain, includes:

forming a first source drain test hole exposing the first source drain test part, a second source drain test hole exposing the second source drain test part, a third source drain test hole exposing the third source drain test part, a fourth source drain test hole exposing the fourth source drain test part, and a fifth source drain test hole exposing the fifth source drain test part in the second interlayer insulation layer by using a patterning process.

Based on the same inventive concept, an embodiment of the disclosure further provides a display panel, including the display substrate provided by the embodiment of the disclosure, and an electroluminescent device located on the display substrate.

In other words, the display panel provided by the embodiment of the disclosure is an electroluminescent display panel, the electroluminescent device may be an organic light-emitting diode (OLED) device, or may also be a quantum dot light emitting diodes (QLED) device. The electroluminescent device may include an anode, a light-emitting layer and a cathode which are arranged in stack. Furthermore, the light-emitting layer may further include a hole injection layer, a hole transport layer, an electron transport layer, an electron injection layer and other film layers.

As shown in FIG. 3, the anode of the OLED is electrically connected with a drain of a sixth transistor T6 and a drain of a seventh transistor T7, and the cathode of the OLED is electrically connected with a second power end VSS. During specific implementation, one of a first power end VDD or the second power end VSS is a high-voltage end, and the other one is a low-voltage end. For example, the first power end VDD is a voltage source to output a constant fifth voltage signal, the fifth voltage signal is a positive voltage, the second power end VSS may be a voltage source to output a constant sixth voltage signal, and the sixth voltage signal is a negative voltage. Certainly, during specific implementation, the second power end VSS may also be grounded.

To sum up, according to the display substrate, the testing method therefor and the preparation method therefor, and the display panel provided by the embodiments of the disclosure, before forming the source drain layer, a gate contact hole exposing the first gate layer is formed in an area where the gate test pad needs to be arranged, in this way, the gate test pad may be formed while a source drain is formed, platinum does not need to be additionally arranged in an overlap joint mode to serve as the test probe, thus, the contact resistance between the gate test pad and the first gate layer may be reduced, the voltage signal can be accurately input into the transistor through the gate test pad during the electrical test, so the success rate of the electrical test for the transistor in the pixel circuit can be improved. Moreover, the capacity of continuous testing for the drive transistor in the pixel circuit can be improved, the preparation process flows of the display substrate can be saved, and the preparation cost and the testing cost of the display substrate are reduced.

Apparently, those skilled in the art can make various modifications and variations for the disclosure without departing from the spirit and scope of the disclosure. In this case, if these modifications and variations for the disclosure fall within the scope of claims and their equivalents, the disclosure also intends to contain these modifications and variations.

What is claimed is:

1. A display substrate, comprising: a base substrate and a pixel circuit on the base substrate; wherein
   the pixel circuit comprises: an active layer, a first gate insulation layer, a first gate layer, a second gate insulation layer, a second gate layer, a first interlayer insulation layer, a source drain layer and a second interlayer insulation layer disposed on the base substrate in that order; the pixel circuit comprises a plurality of transistors; active layers of the plurality of transistors are integrated;
   the pixel circuit further comprises: a gate contact hole running through the first interlayer insulation layer and the second gate insulation layer and exposing part of the first gate layer, and a source drain contact hole running through the first interlayer insulation layer, the second gate insulation layer and the first gate insulation layer and exposing part of the active layer;
   the source drain layer comprises: a gate test pad electrically connected with the first gate layer through the gate contact hole, and a source and a drain electrically connected with the active layer through the source drain contact hole;
   the second interlayer insulation layer comprises: a gate test hole and a source drain test hole running through the second interlayer insulation layer in a thickness direction of the second interlayer insulation layer; wherein the gate test hole exposes the gate test pad, and the source drain test hole exposes part of an area in the source drain layer other than the gate test pad;
   wherein the pixel circuit comprises: a first transistor, a second transistor, a third transistor, a fourth transistor, a fifth transistor, a sixth transistor, a seventh transistor, a storage capacitor, a scanning line, a reset line, an initialization signal line and a light-emitting control line;
   a gate of the third transistor is electrically connected with a first electrode of the storage capacitor, a source of the first transistor and a drain of the second transistor respectively; a source of the third transistor is electrically connected with a drain of the fourth transistor and a drain of the fifth transistor respectively; a drain of the third transistor is electrically connected with a source of the second transistor and a source of the sixth transistor respectively;
   a gate of the first transistor is electrically connected with the reset line;
   a drain of the first transistor and a drain of the seventh transistor are electrically connected with the initialization signal line respectively;
   a second electrode of the storage capacitor is electrically connected with a first power end,
   a gate of the second transistor and a gate of the fourth transistor are electrically connected with the scanning line respectively;
   a source of the fourth transistor is electrically connected with a data signal end;
   a gate of the fifth transistor and a gate of the sixth transistor are electrically connected with the light-emitting control line respectively; and
   a drain of the sixth transistor is electrically connected with the drain of the seventh transistor;
   wherein the source drain layer further comprises: a first source drain test part, a second source drain test part, a third source drain test part, a fourth source drain test part, and a fifth source drain test part; wherein
   the first source drain test part is electrically connected with the source of the first transistor, the drain of the second transistor and the gate of the third transistor respectively;
   the second source drain test part is electrically connected with the drain of the first transistor and the drain of the seventh transistor respectively;
   the third source drain test part is electrically connected with a source of the fifth transistor;
   the fourth source drain test part is electrically connected with the drain of the sixth transistor and a source of the seventh transistor respectively;
   the fifth source drain test part is electrically connected with the source of the fourth transistor;
   the source drain test hole comprises: a first source drain test hole exposing the first source drain test part, a second source drain test hole exposing the second source drain test part, a third source drain test hole exposing the third source drain test part, a fourth source drain test hole exposing the fourth source drain test part, and a fifth source drain test hole exposing the fifth source drain test part.

2. The display substrate according to claim 1, wherein, the first gate layer comprises: the second electrode of the storage capacitor, the scanning line, the reset line, the light-emitting control line, the gate of the first transistor, the gate of the second transistor, the gate of the third transistor, the gate of the fourth transistor, the gate of the fifth transistor, the gate of the sixth transistor and the gate of the seventh transistor;
   the gate contact hole comprises: a first gate contact hole exposing part of the reset line, a second gate contact hole exposing part of the light-emitting control line, and a third gate contact hole exposing part of the scanning line;
   the gate test pad comprises: a first gate test pad electrically connected with the reset line through the first gate contact hole, a second gate test pad electrically connected with the light-emitting control line through a second gate contact hole, and a third gate test pad electrically connected with the scanning line through the third gate contact hole; and
   the gate test hole comprises: a first gate test hole exposing the first gate test pad, a second gate test hole exposing the second gate test pad, and a third gate test hole exposing the third gate test pad.

3. A testing method for the display substrate according to claim 1, comprising:
disconnecting a transistor in part of the pixel circuit by cutting off part of a line in the pixel circuit according to a to-be-tested transistor in the pixel circuit; and
performing an electrical test on the to-be-tested transistor through the gate test hole and the source drain test hole.

4. The method according to claim 3, wherein
the to-be-tested transistor is the first transistor or the seventh transistor, and the cutting off part of a line in the pixel circuit to disconnect the transistor in part of the pixel circuit according to the to-be-tested transistor in the pixel circuit, comprises:
disconnecting the second transistor, the third transistor, the fourth transistor, the fifth transistor, the sixth transistor and the storage capacitor from the pixel circuit; and
the performing the electrical test on the to-be-tested transistor through the gate test hole and the source drain test hole comprises:
when the to-be-tested transistor is the first transistor, providing a first voltage signal to a first gate test pad through a first gate test hole; providing a second voltage signal to a first source drain test hole through a first source drain test hole; and outputting a test signal of a second source drain test part through a second source drain test hole;
when the to-be-tested transistor is the seventh transistor, providing the first voltage signal to the first gate test pad through the first gate test hole, providing the second voltage signal to a fourth source drain test part through a fourth source drain test hole and outputting a test signal of the second source drain test part through the second source drain test hole.

5. The method according to claim 4, wherein the to-be-tested transistor is the third transistor;
disconnecting the transistor in part of the pixel circuit by cutting off part of the line in the pixel circuit according to the to-be-tested transistor in the pixel circuit, comprises:
disconnecting the first transistor, the second transistor, the fourth transistor, the seventh transistor and the storage capacitor from the pixel circuit;
the performing the electrical test on the to-be-tested transistor through the gate test hole and the source drain test hole, comprises:
providing the first voltage signal to the first source drain test part through the first source drain test hole, providing a third voltage signal to a second gate test pad through a second gate test hole, providing the second voltage signal to a third source drain test part through a third source drain test hole and outputting a test signal of the fourth source drain test part through the fourth source drain test hole.

6. The method according to claim 4, wherein the to-be-tested transistor is one of the following: the second transistor, the fourth transistor, the fifth transistor or the sixth transistor;
disconnecting the transistor in part of the pixel circuit by cutting off part of the line in the pixel circuit according to the to-be-tested transistor in the pixel circuit, comprises:
disconnecting the first transistor, the seventh transistor and the storage capacitor from the pixel circuit; and
the performing the electrical test on the to-be-tested transistor through the gate test hole and the source drain test hole comprises:

when the to-be-tested transistor is the second transistor, providing the first voltage signal to a third gate test pad through a third gate test hole, providing the third voltage signal to the second gate test pad through the second gate test hole, providing the second voltage signal to the fourth source drain test part through the fourth source drain test hole and outputting a test signal of the first source drain test part through the first source drain test hole;
when the to-be-tested transistor is the fourth transistor, providing the first voltage signal to the third gate test pad through the third gate test hole, providing the third voltage signal to the second gate test pad through the second gate test hole, providing the second voltage signal to a fifth source drain test part through a fifth source drain test hole and outputting a test signal of the third source drain test part through the third source drain test hole;
when the to-be-tested transistor is the fifth transistor, providing the first voltage signal to the second gate test pad through the second gate test hole, providing the third voltage signal to the first source drain test part through the first source drain test hole, providing the second voltage signal to the third source drain test part through the third source drain test hole and outputting a test signal of the fourth source drain test part through the fourth source drain test hole;
when the to-be-tested transistor is the sixth transistor, providing the first voltage signal to the second gate test pad through the second gate test hole, providing the third voltage signal to the first source drain test part through the first source drain test hole, providing the second voltage signal to the fourth source drain test part through the fourth source drain test hole and outputting a test signal of the third source drain test part through the third source drain test hole.

7. A preparation method for the display substrate according to claim 1, comprising:
forming the active layer, the first gate insulation layer, the first gate layer, the second gate insulation layer, the second gate layer and the first interlayer insulation layer of the pixel circuit on the base substrate in that order;
forming the gate contact hole running through the first interlayer insulation layer and the second gate insulation layer and exposing the part of the first gate layer;
forming the source drain contact hole running through the first interlayer insulation layer, the second gate insulation layer and the first gate insulation layer and exposing the active layer;
forming a pattern of a source drain layer on the first interlayer insulation layer;
forming the second interlayer insulation layer on the source drain layer, forming the gate test hole running through the second interlayer insulation layer in the second interlayer insulation layer in the thickness direction of the second interlayer insulation layer and exposing the gate test pad and forming the source drain test hole running through the second interlayer insulation layer in the thickness direction of the second interlayer insulation layer and exposing the part of the area in the source drain layer other than the gate test pad.

8. The method according to claim 7, wherein
the forming the gate contact hole running through the first interlayer insulation layer and the second gate insulation layer and exposing part of the first gate layer, comprises:

forming, by using a patterning process, a first gate contact hole exposing part of the reset line, a second gate contact hole exposing part of the light-emitting control line and a third gate contact hole exposing part of the scanning line;

forming, on the first interlayer insulation layer, the gate test pad in the source drain layer comprises:

depositing a source drain material to form an electrode film;

forming, by patterning the electrode film, a first gate test pad electrically connected with a gate of the first transistor and a gate of the seventh transistor respectively through the first gate contact hole, a second gate test pad electrically connected with a gate of the fifth transistor and a gate of the sixth transistor respectively through the second gate contact hole, and a third gate test pad electrically connected with a gate of the second transistor and a gate of the fourth transistor respectively through the third gate contact hole; and the forming the gate test hole running through the second interlayer insulation layer and exposing the gate test pad, comprises:

forming, in the second interlayer insulation layer by using a patterning process, a first gate test hole exposing the first gate test pad, a second gate test hole exposing the second gate test pad and a third gate test hole exposing the third gate test pad.

9. The method according to claim 8, wherein while forming the gate test pad, the source and the drain in the source drain layer, the method further comprises:

forming the first source drain test part electrically connected with the source of the first transistor, the drain of the second transistor and the gate of the third transistor respectively;

forming the second source drain test part electrically connected with the drain of the first transistor and the drain of the seventh transistor respectively;

forming the third source drain test part electrically connected with the source of the fifth transistor;

forming the fourth source drain test part electrically connected with the drain of the sixth transistor and the source of the seventh transistor respectively; and forming the fifth source drain test part electrically connected with the source of the fourth transistor; and the forming the source drain test hole running through the second interlayer insulation layer and exposing part of the source or the drain, comprises:

forming, in the second interlayer insulation layer by using a patterning process, the first source drain test hole exposing the first source drain test part, the second source drain test hole exposing the second source drain test part, the third source drain test hole exposing the third source drain test part, the fourth source drain test hole exposing the fourth source drain test part, and the fifth source drain test hole exposing the fifth source drain test part.

10. A display panel, comprising the display substrate according to claim 1 and an electroluminescent device located on the display substrate.

11. The display panel according to claim 10, wherein, the first gate layer comprises: the second electrode of the storage capacitor, the scanning line, the reset line, the light-emitting control line, the gate of the first transistor, the gate of the second transistor, the gate of the third transistor, the gate of the fourth transistor, the gate of the fifth transistor, the gate of the sixth transistor and the gate of the seventh transistor;

the gate contact hole comprises: a first gate contact hole exposing part of the reset line, a second gate contact hole exposing part of the light-emitting control line, and a third gate contact hole exposing part of the scanning line;

the gate test pad comprises: a first gate test pad electrically connected with the reset line through the first gate contact hole, a second gate test pad electrically connected with the light-emitting control line through a second gate contact hole, and a third gate test pad electrically connected with the scanning line through the third gate contact hole; and the gate test hole comprises: a first gate test hole exposing the first gate test pad, a second gate test hole exposing the second gate test pad, and a third gate test hole exposing the third gate test pad.

* * * * *